United States Patent
Fukunaga et al.

(10) Patent No.: US 6,774,021 B2
(45) Date of Patent: Aug. 10, 2004

(54) PATTERN FORMING METHOD AND PATTERN FORMING DEVICE

(75) Inventors: Toshiaki Fukunaga, Kanagawa (JP); Mitsuru Sawano, Kanagawa (JP)

(73) Assignee: Fuji Photo Film Co., Ltd., Kanagawa (JP)

(*) Notice: Subject to any disclaimer, the term of this patent is extended or adjusted under 35 U.S.C. 154(b) by 0 days.

(21) Appl. No.: 10/456,487

(22) Filed: Jun. 9, 2003

(65) Prior Publication Data

US 2003/0228743 A1 Dec. 11, 2003

(30) Foreign Application Priority Data

Jun. 7, 2002 (JP) ........................... 2002-167635
Nov. 13, 2002 (JP) ........................... 2002-329095

(51) Int. Cl.[7] ..................... H01L 21/00; B05B 7/00; B05C 5/00; B05C 3/00
(52) U.S. Cl. ................... 438/584; 438/21; 118/300; 118/323; 118/400; 118/421
(58) Field of Search .................... 438/584, 21, 758, 438/674; 118/300, 301, 323, 400, 421

(56) References Cited

U.S. PATENT DOCUMENTS

| | | | |
|---|---|---|---|
| 3,946,398 A | | 3/1976 | Kyser et al. |
| 4,189,734 A | | 2/1980 | Kyser et al. |
| 6,071,387 A | * | 6/2000 | Ohba ........................ 204/198 |
| 6,101,937 A | * | 8/2000 | Murakami ................ 101/123 |
| 2003/0059984 A1 | * | 3/2003 | Sirringhaus et al. ....... 438/141 |
| 2003/0183165 A1 | * | 10/2003 | Kakimoto et al. ........... 118/35 |

FOREIGN PATENT DOCUMENTS

| | | |
|---|---|---|
| JP | 2-51734 | 11/1990 |
| JP | 5-50601 | 3/1993 |
| JP | 9-214106 | 8/1997 |
| JP | 11-163499 | 6/1999 |
| JP | 11-207959 | 8/1999 |
| JP | 2002-164635 | 6/2002 |
| JP | 2003-80694 | 3/2003 |

* cited by examiner

*Primary Examiner*—Michael Trinh
(74) *Attorney, Agent, or Firm*—Sughrue Mion, PLLC

(57) ABSTRACT

A pattern forming method has the steps of: forming a pattern by discharging droplets of a conductive material forming solution onto an insulating substrate; forming a conductive layer pattern on the pattern by discharging droplets of a solution which becomes a growth core; and forming a metal pattern by immersing the conductive layer pattern in a plating liquid. The pattern forming method may further have the step of forming a protective layer on a surface of the metal pattern by discharging droplets of an insulating material forming solution except at regions which are to become electrodes of the metal pattern.

5 Claims, 19 Drawing Sheets

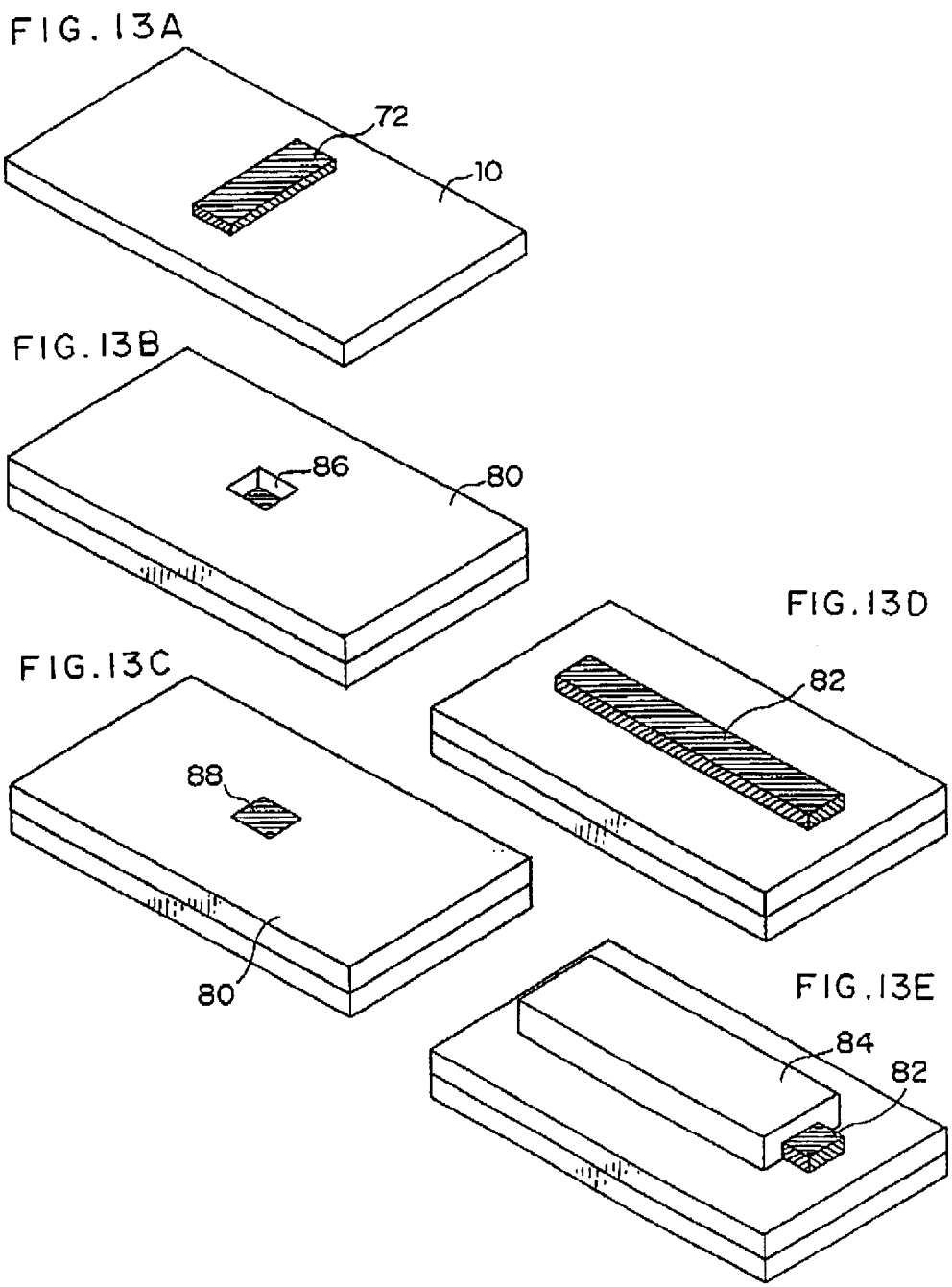

F I G. 16 A
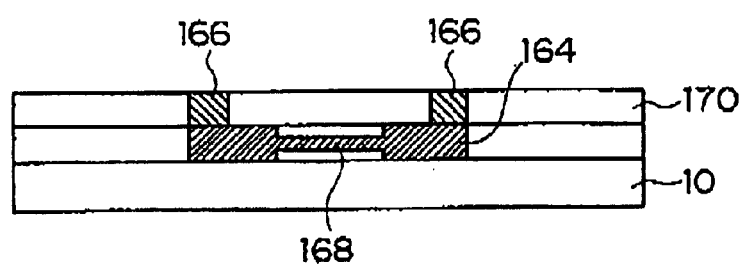
F I G. 16 B
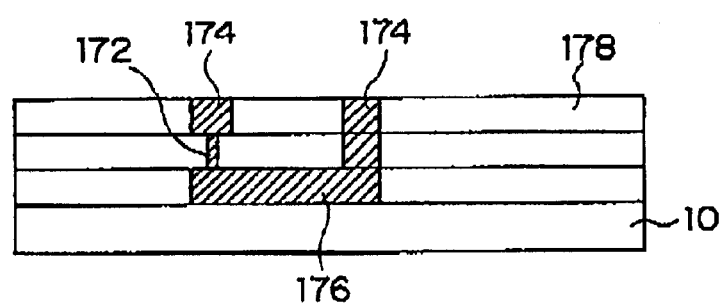

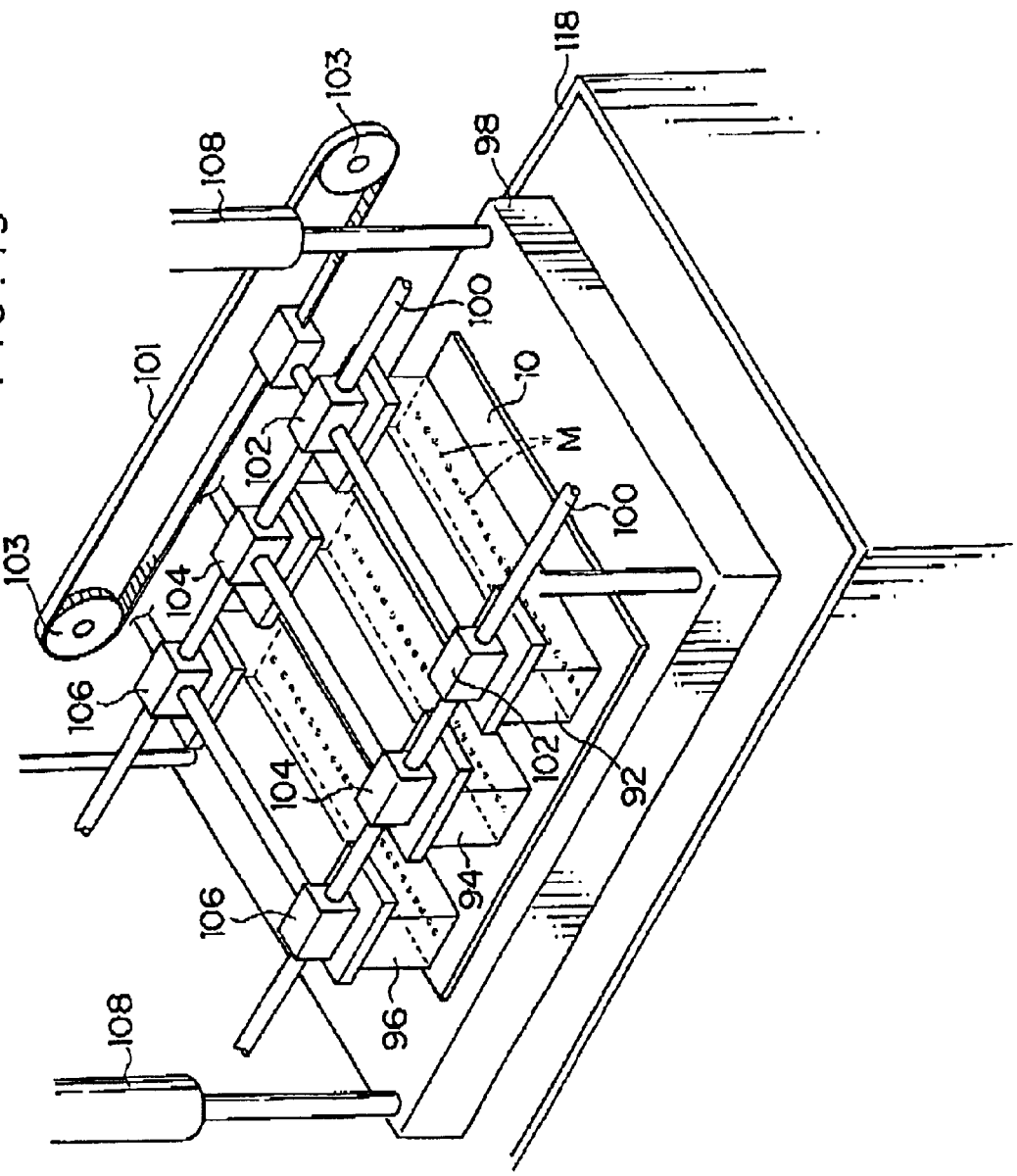

PATTERN FORMING METHOD AND PATTERN FORMING DEVICE

CROSS-REFERENCE TO RELATED APPLICATION

This application claims priority under 35 USC 119 from Japanese Patent Application Nos. 2002-167635 and 2002-329095, the disclosure of which is incorporated by reference herein.

BACKGROUND OF THE INVENTION

1. Field of the Invention

The present invention relates to a pattern forming method and a pattern forming device for forming a wiring pattern or a circuit of a wiring substrate.

2. Description of the Related Art

In conventional wiring pattern forming methods, a three-dimensional wiring pattern (a solid wiring pattern) is formed by repeating the processes of dielectric film formation, photolithography, and plating.

In such methods, a highly-accurate mask aligning technique is required at each layer, and a drawback arises in that the processes become longer. Further, there is the need to manufacture an expensive mask each time the wiring pattern of the wiring substrate changes, and a drawback arises in that costs increase.

In the photolithographic process, the following method (spin coating) is employed: a wiring substrate, on which large droplets of a photosensitive polymer solution have been applied, is rotated at high speed around an axis. The photosensitive polymer solution is thereby discharged toward the outer side, and the wiring substrate is coated by a thin film of the photosensitive polymer solution.

However, when the wiring substrate is rotated at high speed, almost all of the photosensitive polymer solution scatters without coating the surface, which is a waste of the photosensitive polymer solution.

Moreover, it is easy for dust to adhere to the surface of the wiring substrate. When a liquid organic substance is applied on the surface of the wiring substrate, protrusions form due to the adhered dust, and regions shaded by these protrusions are formed behind the protrusions. Thus, relatively thin, radially-shaped traces of the organic substance remain at the rear sides of these protrusions, and pattern defects arise.

SUMMARY OF THE INVENTION

In view of the aforementioned, an object of the present invention is to provide a wiring pattern forming method and a wiring pattern forming device which can flexibly handle changes in wiring patterns without the need for a mask. Another object of the present invention is to provide a wiring pattern forming method and a wiring pattern forming device which are relatively strong with respect to dust and defects existing on a substrate, and in which there is no waste of solution during the coating processes.

A first aspect of the present invention provides a pattern forming method which comprises the steps of: forming a pattern by discharging droplets of a conductive material forming solution onto an insulating substrate; forming a conductive layer pattern on the pattern by discharging droplets of a solution which becomes a growth core; and forming a metal pattern by immersing the conductive layer pattern in a plating liquid.

In the first aspect of the present invention, because a pattern is formed by discharging droplets of a conductive material forming solution onto an insulating substrate, there is no need for a mask. Further, a thin film can be formed by dispersing the conductive material forming solution in water. Thus, a fine pattern can be formed.

In the first aspect, the droplets of the insulating material forming solution, the droplets of the conductive material forming solution, and the droplets of the solution which becomes a growth core are discharged perpendicularly to the insulating substrate.

Due to the droplets of the respective solutions being discharged perpendicularly to the insulating substrate, the wiring pattern is not affected by dust or defects existing at the insulating substrate, and pattern defects do not arise.

Droplets of the solution which becomes a growth core are discharged onto the pattern which is formed as described above. In this way, a conductive layer pattern is formed. The conductive layer pattern is immersed in a plating liquid, and a metal pattern is formed. Note that the metal pattern may be formed by using copper as the copper plating. A pattern which has high electrical conductivity can thereby be obtained. Moreover, the pattern may be dried and rinsed before the droplets of the solution which becomes a growth core are discharged.

Moreover, the pattern forming method further comprises the step of forming a protective layer on a surface of the metal pattern by discharging droplets of an insulating material forming solution except at regions which are to become electrodes of the metal pattern.

A protective layer is formed on the surface of the metal pattern by discharging droplets of an insulating material forming solution except at regions which are to become electrodes of the metal pattern. This protective layer may be formed as needed (on demand).

Here, "pattern" encompasses wiring patterns and circuits. By changing the thickness or the configuration of the pattern, a resistor, a capacitor, or the like can be formed.

Further, a metal pattern is formed three-dimensionally on the insulating substrate by repeating the respective steps plural times.

By repeating plural times the discharging of the droplets, a metal pattern can be formed three-dimensionally without positioning masks many times.

Moreover, the droplets of the insulating material forming solution, the droplets of the conductive material forming solution, and the droplets of the solution which becomes a growth core are discharged from ink jet heads in accordance with a layout of the patterns and the protective layer.

The pattern can be easily changed by controlling the positions of discharging, merely by inputting pattern information of the pattern to the control device which controls the ink jet heads. Thus, the process for manufacturing a wiring substrate or a circuit can be shortened.

A second aspect of the present invention provides a pattern forming method which comprises the steps of: forming a pattern groove on an insulating substrate by discharging droplets of an insulating material forming solution; discharging droplets of a conductive material forming solution into the pattern groove; forming a conductive layer pattern by discharging droplets of a solution which becomes a growth core, onto a pattern formed by the conductive material forming solution, and forming a metal pattern by immersing the conductive layer pattern in a plating liquid.

A pattern groove is formed on an insulating substrate by discharging droplets of an insulating material forming solution. A pattern can be formed by discharging droplets of a conductive material forming solution into the groove portion of the pattern groove so as to fill the groove.

Namely, by forming a metal pattern in the groove formed by the insulating material forming solution, short circuiting between metal patterns can reliably be prevented.

A third aspect of the present invention provides a pattern forming device which comprises: an insulating solution ink jet head discharging an insulating material forming solution; a conductive solution ink jet head discharging a conductive material forming solution; a growth core solution ink jet head discharging a solution which becomes a growth core; a heating mechanism heating an insulating substrate set on a base; a head scanning mechanism which causes the insulating solution ink jet head, the conductive solution ink jet head, and the growth core solution ink jet head to scan above the base; a control mechanism which, on the basis of inputted layout information of a wiring pattern and a protective layer protecting the wiring pattern, operates the scanning mechanism and makes droplets be discharged from nozzles of the insulating solution ink jet head, the conductive solution ink jet head, and the growth core solution ink jet head; a base raising/lowering mechanism which raises and lowers the base; and a moving mechanism at which a rinsing tank and a plating tank are disposed, and which moves one of the rinsing tank and the plating tank to beneath the base as needed.

All of the processes for forming the pattern on the insulating substrate are carried out in a state in which the insulating substrate is positioned on the base. Thus, there is no need to position the insulating substrate for each process, and a highly accurate pattern can be formed.

In the third aspect of the present invention, the insulating solution ink jet head, the conductive solution ink jet head, and the growth core solution ink jet head are disposed in lines.

Moreover, the insulating solution ink jet head, the conductive solution ink jet head, and the growth core solution ink jet head are movable only in a direction substantially perpendicular to a direction in which the insulating solution ink jet head, the conductive solution ink jet head, and the growth core solution ink jet head are disposed in lines.

By disposing the ink jet heads in lines along the transverse direction of the insulating substrate, a pattern can be formed at one time by scanning in one direction.

Moreover, the conductive solution ink jet head and the growth core solution ink jet head are thermal-type ink jet heads.

The insulating material forming solution may be a solution in which a heat-resistant resin is dissolved in a solvent. Further, the droplets of the conductive material forming solution and the solution which becomes a growth core may be discharged from thermal-type ink jet heads, and the droplets of the insulating material forming solution may be discharged from a piezoelectric-type ink jet head.

In addition, the insulating solution ink jet head, the conductive solution ink jet head, and the growth core solution ink jet head are each provided with a plurality of nozzles which discharge droplets.

A plurality of discharging nozzles of the ink jet head can be formed in a line along the transverse direction of the insulating substrate, and droplets can be discharged from the respective discharging nozzles in accordance with the layout of the pattern and the protective layer.

BRIEF DESCRIPTION OF THE DRAWINGS

FIGS. 13A through 13E are perspective views showing manufacturing processes of a wiring pattern forming method relating to a seventh embodiment of the present invention.

FIG. 16A is a cross-sectional view showing a resistor formed in a planar form according to a wiring pattern forming method relating to a ninth embodiment of the present invention.

FIG. 16B is a cross-sectional view showing a resistor formed in a layer direction according to the wiring pattern forming method relating to the ninth embodiment of the present invention.

FIG. 19 is a perspective view of the wiring pattern forming device of FIG. 18.

DETAILED DESCRIPTION OF THE INVENTION

A pattern forming method relating to a first embodiment of the present invention will be described hereinafter. Note that the wiring patterns which will be described hereinafter are formed by using a completely automatic wiring pattern forming device 90 shown in FIGS. 18 and 19. However, provided that the wiring pattern is formed by applying droplets onto a substrate, a partially manual method of forming a wiring pattern may be used, and the ink jet system is not specified.

Figure 1A:
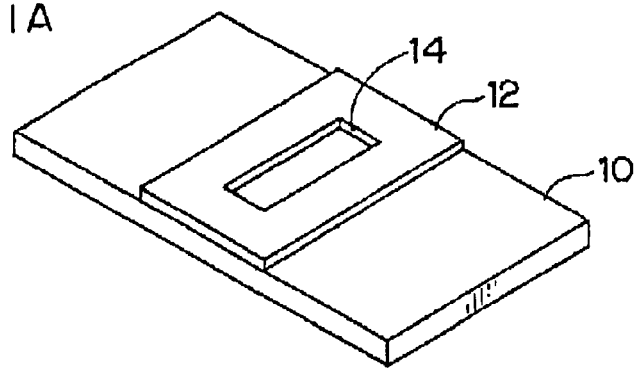
FIGS. 1A through 1D are perspective views showing manufacturing processes of a wiring pattern forming method relating to a first embodiment of the present invention.
Figure 2A:
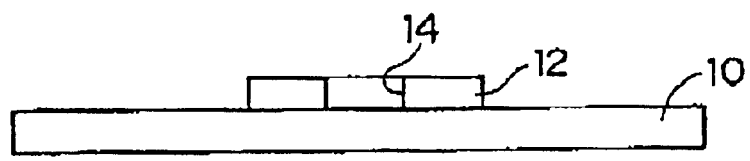
FIGS. 2A through 2D are cross-sectional views showing the manufacturing processes of the wiring pattern forming method relating to the first embodiment of the present invention.

As shown in FIGS. 1A and 2A, solid partitioning walls 12 are formed at intervals t of 10 to 50 μm on the surface of an insulating substrate 10 by droplets of a resin solution, in which polyimide resin is diluted in an organic solvent, being discharged from an electrostatic-type ink jet head. A groove 14 formed at the inner side of the solid partitioning wall 12 becomes the wiring pattern.

Figure 1B:
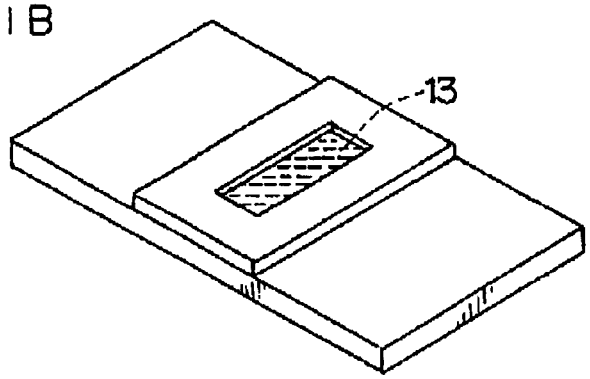
Figure 2B:
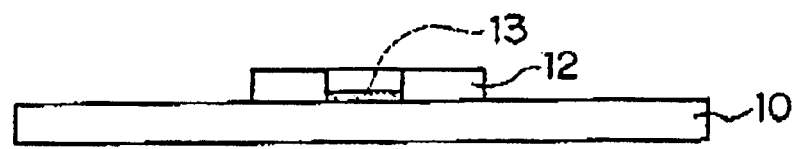

Next, as shown in FIGS. 1B and 2B, droplets of a stannous chloride solution, which becomes the core of the plating and which serves as a conductive material forming solution, are discharged by a thermal-type ink jet so as to be coated within the groove 14. After the coated droplets are dried and rinsed, droplets of a solution containing palladium (a palladium chloride aqueous solution), which serves as a solution for the growth core, are discharged and coated by a thermal-type ink jet.

Figure 1C:
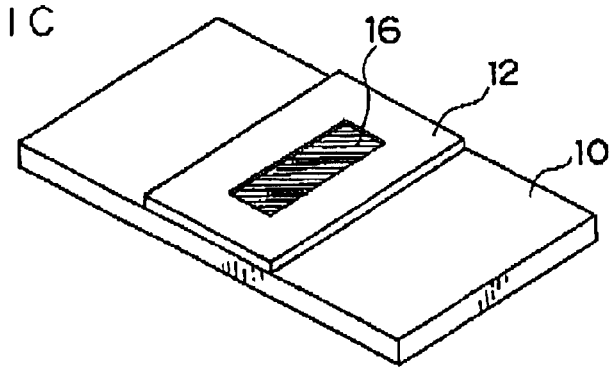
Figure 2C:
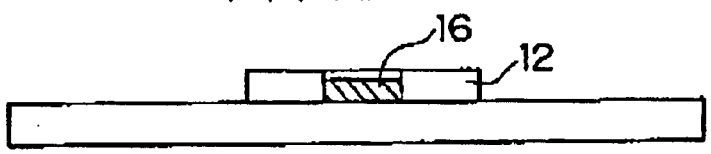

At this time, the Sn contained in the stannous chloride solution and the Pd undergo an oxidation reduction reaction, and a conductive thin layer 13, which is shaped as the wiring pattern and is formed from the metal Pd which has high catalytic activity, is formed. When a copper plating liquid is applied to the insulating substrate 10 on which the conductive thin layer 13 is formed, as shown in FIGS. 1C and 2C, the copper ions within the solution are reduced with the palladium, which is a catalyst, being the core. In this way, the copper precipitates and a metal wiring pattern 16 is formed. Note that the metal wiring pattern 16 is thicker than the conductive thin film 13.

Figure 1D:
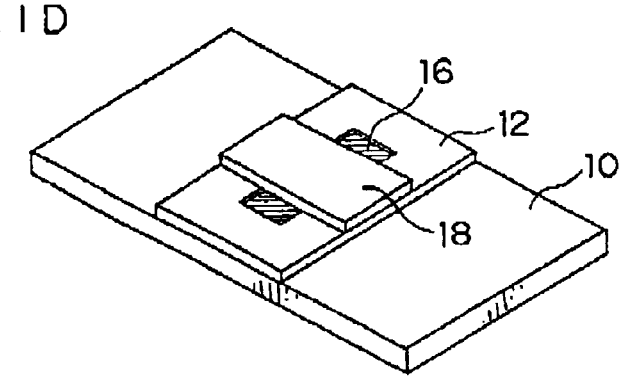
Figure 2D:
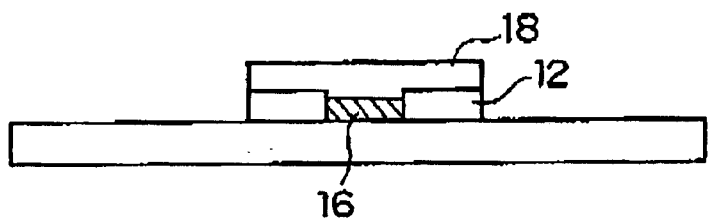

In accordance with this method, it is possible to form the metal wiring pattern 16, which is formed of copper, between two points in the same plane. Next, as shown in FIGS. 1D and 2D, a resin solution, in which polyimide is diluted in an organic solvent, is discharged from an electrostatic-type ink jet head such that only the portions needed for soldering remain as electrodes, and a protective layer 18 of polyimide resin is formed.

The discharging mechanism of the ink jet head which discharges the polyimide resin solution may be a piezoelectric type as disclosed in Japanese Patent Application Publication (JP-B) No. 2-51734, or an electrostatic type as disclosed in Japanese Patent Application Laid-Open (JP-A) No. 5-50601.

In this way, the solutions needed to form the metal wiring pattern are discharged as droplets from ink jet heads. Therefore, a wiring pattern of a printed wiring substrate can be easily formed at a detailed resolution merely by inputting wiring pattern data to a control device, without the need for a mask. Moreover, because the resin solution or the like having detailed resolution is discharged perpendicularly to the insulating substrate, it is difficult for the wiring to be affected by dust and defects of the insulating substrate, and the solution is not wasted in the coating process as is the case in the spin coating method.

Next, a wiring pattern forming method relating to a second embodiment will be described.

Figure 3A:
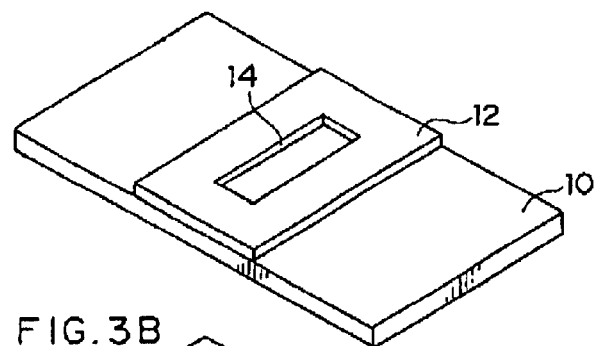
FIGS. 3A through 3F are perspective views showing manufacturing processes of a wiring pattern forming method relating to a second embodiment of the present invention.
Figure 3B:
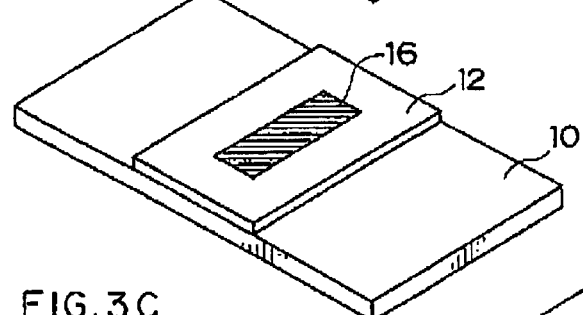
Figure 3C:
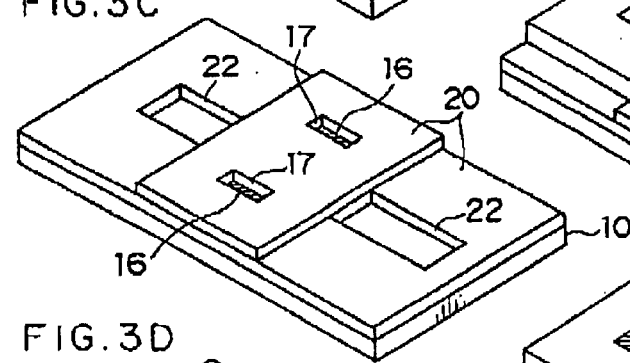
Figure 4A:
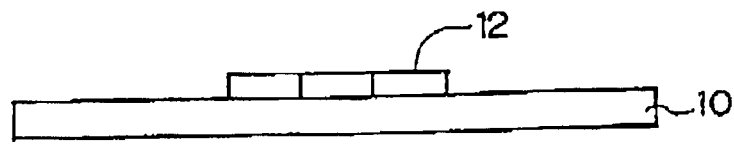
FIGS. 4A through 4F are cross-sectional views showing the manufacturing processes of the wiring pattern forming method relating to the second embodiment of the present invention.
Figure 4B:
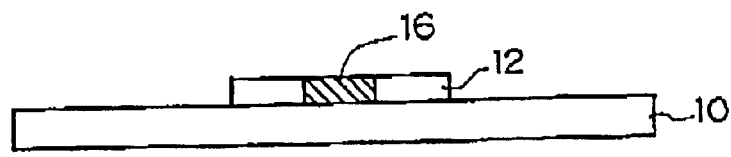
Figure 4C:
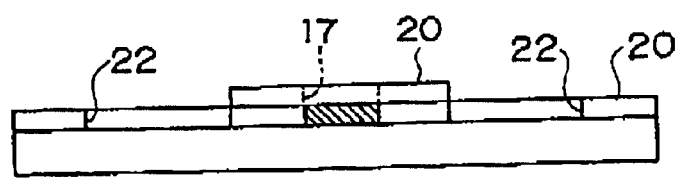

As shown in FIGS. 3A, 3B and 4A, 4B, in the same way as in the first embodiment, the solid partitioning wall 12 is copper plated, such that the metal wiring pattern 16 is formed. Thereafter, as shown in FIGS. 3C and 4C, a polyimide resin solution is discharged from an ink jet head. Electrode portions at both end portions of the metal wiring pattern 16 are exposed at grooves 17, the surface of the metal wiring pattern 16 is covered, and the entire surface of the insulating substrate 10 is covered by a protective layer 20 of polyimide resin.

Grooves 22 of intervals of 10 to 50 μm are formed in the protective layer 20 at both sides of the metal wiring pattern 16. A stannous chloride solution is coated into the grooves 17, 22 by an ink jet head, and is dried and rinsed. Thereafter, a palladium chloride aqueous solution which is a catalyst is discharged by an ink jet head so as to be applied thereat.

Figure 3D:
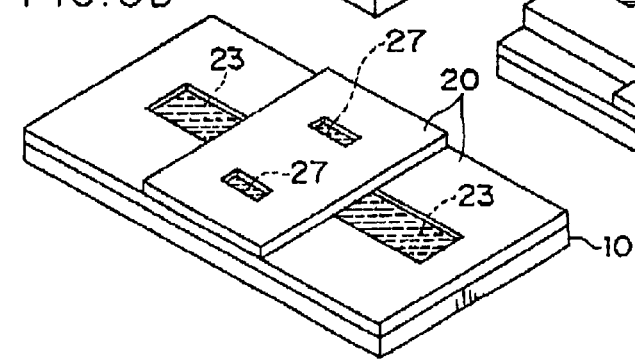
Figure 4D:
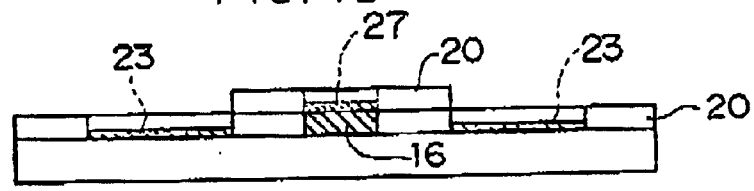

At this time, as shown in FIGS. 3D and 4D, the Sn contained in the stannous chloride solution and the Pd undergo an oxidation reduction reaction, and conductive thin layers 23, 27, which are shaped as the wiring pattern and are formed from the metal Pd which has high catalytic activity, are formed. When a copper plating liquid is applied to the insulating substrate 10 on which these conductive thin layers 23, 27 are formed, the copper ions within the solution are reduced with the palladium, which is a catalyst, being the core. The copper precipitates and metal wiring patterns 24, 25 are formed.

Figure 3E:
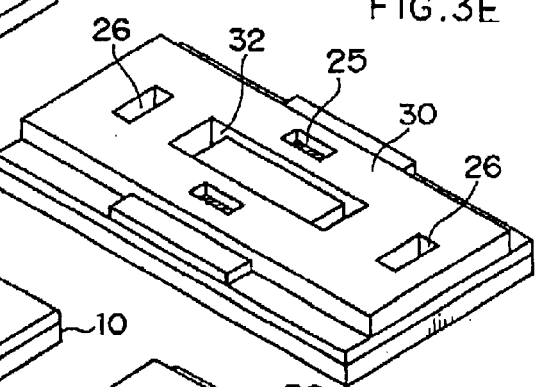
Figure 4E:
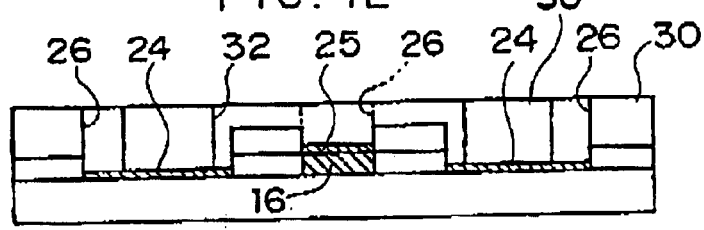

Next, as shown in FIGS. 3E and 4E, a polyimide resin solution is discharged from an ink jet head. The electrode portions of the metal wiring patterns 24 are exposed at the grooves 26, the surfaces of the metal wiring patterns 24 are covered, and the central portion of the insulating substrate 10 is covered by a protective layer 30 of polyimide resin.

A groove 32 is formed in the central portion of the protective layer 30, such that the metal wiring patterns 24 are exposed. Further, the grooves 26 are formed at the both sides of the groove 32. Next, a stannous chloride solution is coated by an ink jet head into the grooves 26, 32, 34, and is dried and rinsed. Thereafter, a palladium chloride aqueous solution which is a catalyst is discharged by an ink jet head so as to be coated thereat.

Figure 3F:
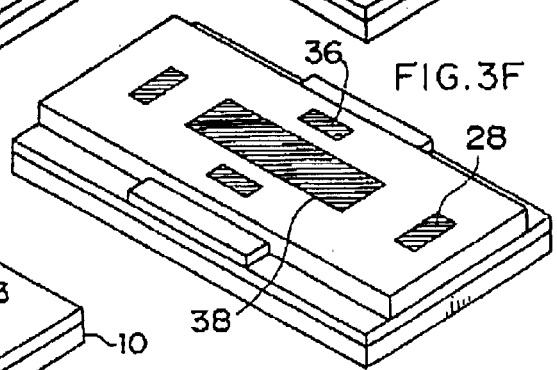
Figure 4F:
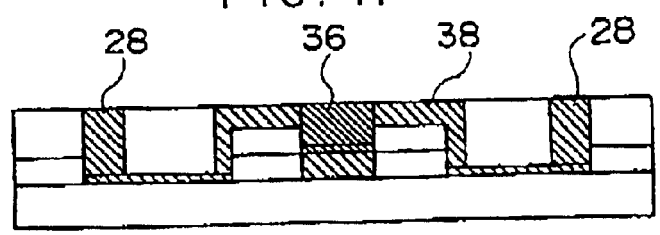

At this time, the Sn contained in the stannous chloride solution and the Pd undergo an oxidation reduction reaction, and conductive thin layers, which are formed from the metal Pd which has high catalytic activity, are formed. When a copper plating liquid is applied to the insulating substrate 10 on which these conductive thin layers are formed, the copper ions within the solution are reduced with the palladium, which is a catalyst, being the core. As shown in FIGS. 3F and 4F, the copper precipitates and metal wiring patterns 28, 36, 38 are formed.

By forming the wiring pattern in this way, an electrical connection between two arbitrary points is possible. Further, wires which intersect at multiple layers can be formed. Moreover, a protective layer may be formed at regions other than those needed in soldering as electrodes.

Next, a third embodiment will be described.

In the third embodiment, connection between metal wiring patterns is possible. Note that because the methods for forming the metal wiring patterns and the protective layers by chemical reactions and the ink jet method are the same as in the first and second embodiments, description thereof will be omitted, and explanation will focus on the processes of formation.

Figure 5A:
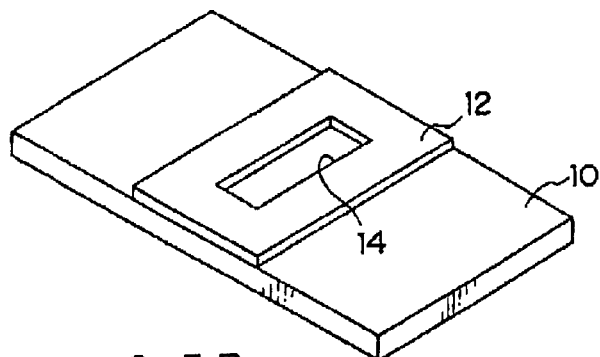
FIGS. 5A through 5E are perspective views showing manufacturing processes of a wiring pattern forming method relating to a third embodiment of the present invention.
Figure 5B:
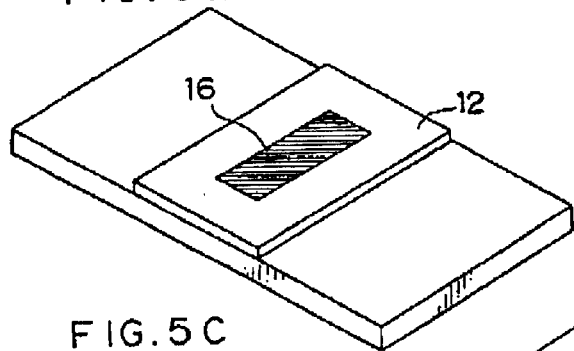
Figure 5C:
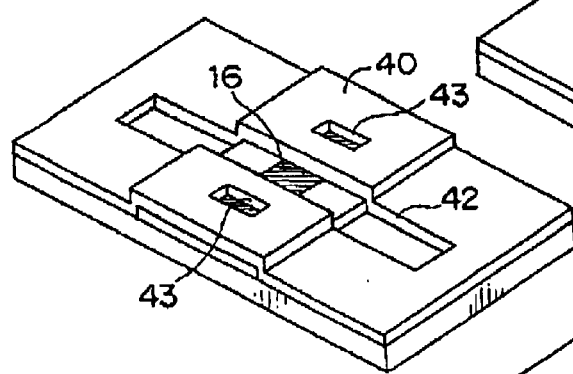
Figure 5D:
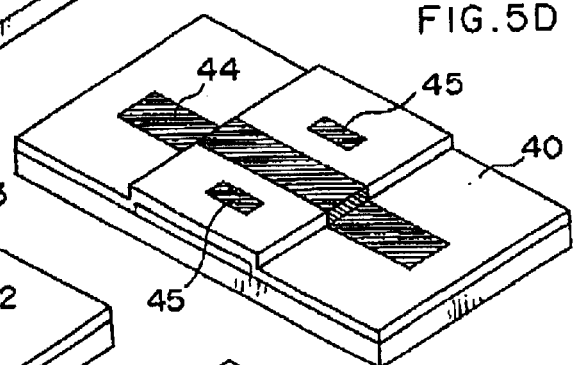
Figure 5E:
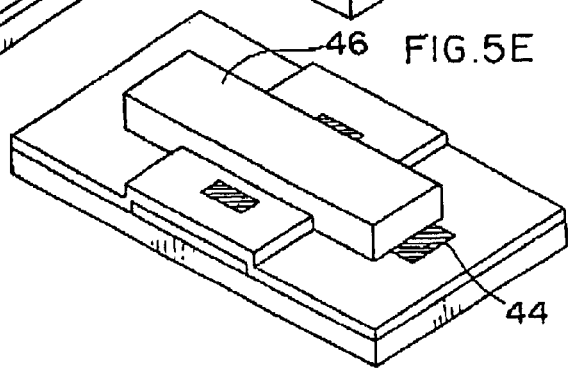
Figure 6A:
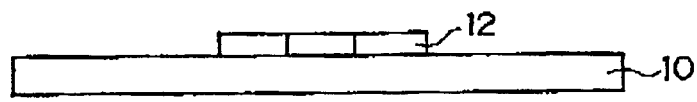
FIGS. 6A through 6E are cross-sectional views showing the manufacturing processes of the wiring pattern forming method relating to the third embodiment of the present invention.
Figure 6B:
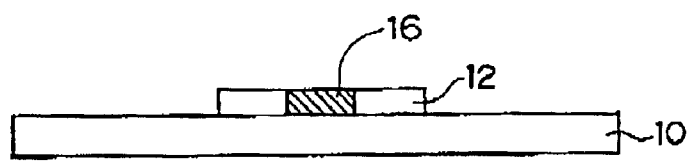
Figure 6C:
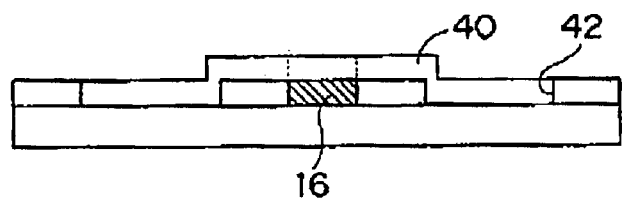
Figure 6D:
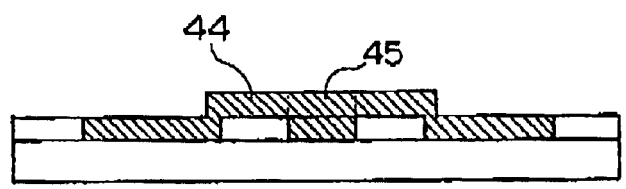
Figure 6E:
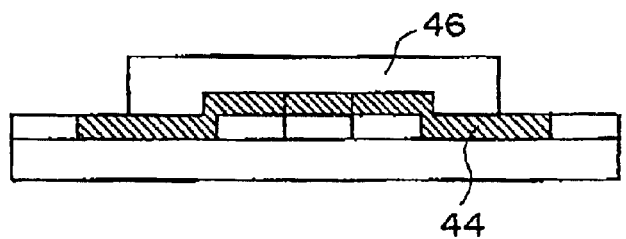

As shown in FIGS. 5A and 6A, the solid partitioning wall 12 is formed on the insulating substrate 10. As shown in FIGS. 5B and 6B, the metal wiring pattern 16 is formed in the groove 14 to the same height as the solid partitioning wall 12. Next, as shown in FIGS. 5C and 6C, the entire insulating substrate 10 is covered by a solid partitioning wall 40 in whose central portion is formed a laterally-long groove 42. Grooves 43 exposing the electrode portions of the metal wiring pattern 16 are formed. Here, as shown in FIGS. 5D and 6D, a metal wiring pattern 44 is formed in the groove 42, and metal wiring patterns 45 are formed in the grooves 43. In this way, the metal wiring pattern 44 and the electrode portions of the wiring pattern 16 are electrically connected. In other words, wires which intersect three-dimensionally can be formed. Finally, in the state in which the electrode portions of the metal wiring pattern are exposed, the central portion of the metal wiring pattern 44 is covered by a protective layer 46.

Next, a fourth embodiment will be described.

Figure 7A:
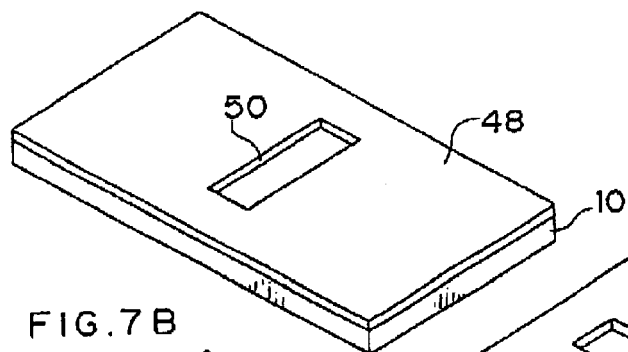
FIGS. 7A through 7F are perspective views showing manufacturing processes of a wiring pattern forming method relating to a fourth embodiment of the present invention.
Figure 7B:
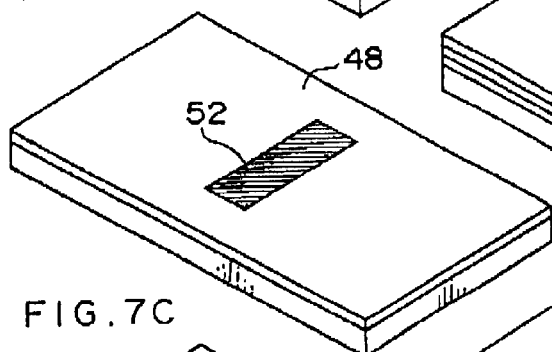
Figure 7C:
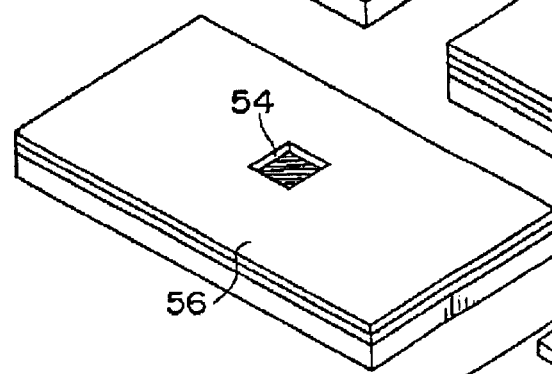
Figure 8A:
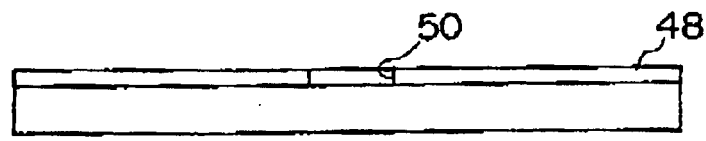
FIGS. 8A through 8F are cross-sectional views showing the manufacturing processes of the wiring pattern forming method relating to the fourth embodiment of the present invention.
Figure 8B:
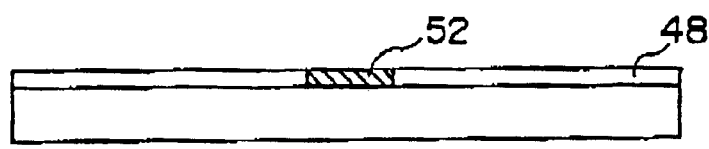
Figure 8C:
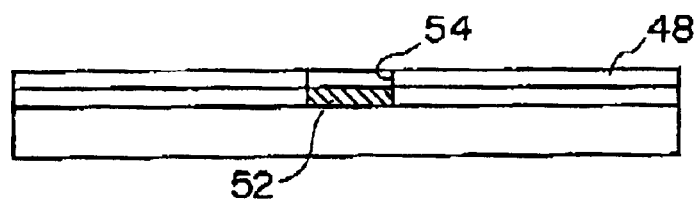

In the fourth embodiment, as shown in FIGS. 7A and 8A, a solid partitioning wall 48 is formed on the entire surface of the insulating substrate 10. As shown in FIGS. 7B and 8B, a metal wiring pattern 52 is formed in a groove 50 to the same height as the solid partitioning wall 48. Next, as shown in FIGS. 7C and 8C, the entire insulating substrate 10 is covered by a solid partitioning wall 56 in whose central portion a rectangular groove 54 is formed. The electrode portion of the metal wiring pattern 52 is exposed. A metal wiring pattern 57 is formed in the groove 54. In this way, the metal wiring pattern 57 and the electrode portion of the metal wiring pattern 52 are electrically connected.

Figure 7D:
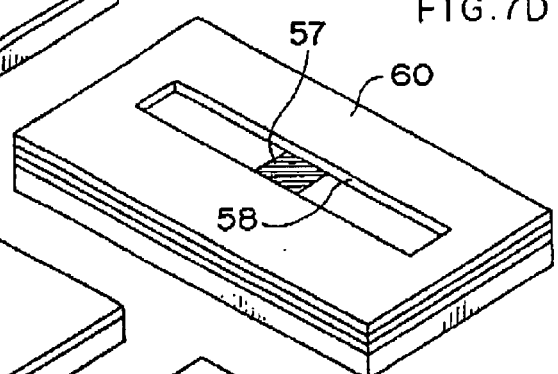
Figure 7E:
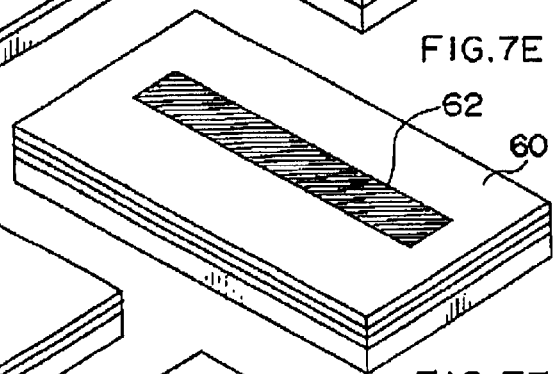
Figure 7F:
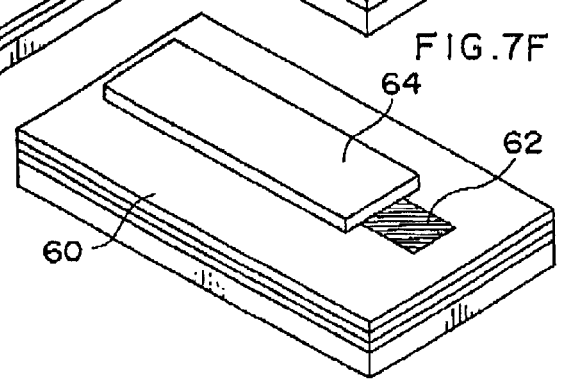
Figure 8D:
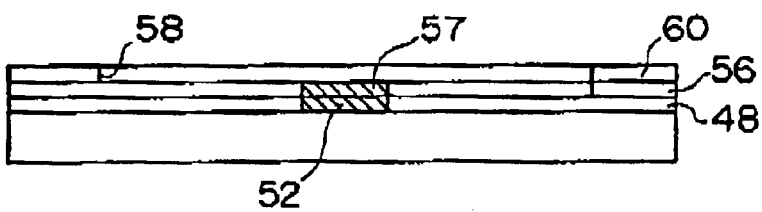
Figure 8E:
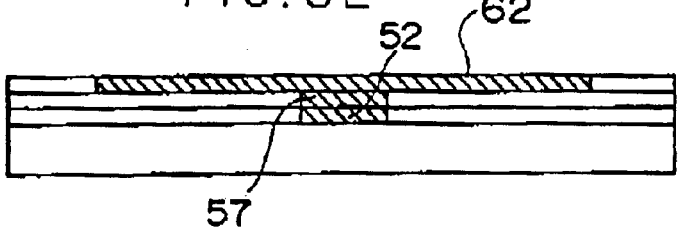
Figure 8F:
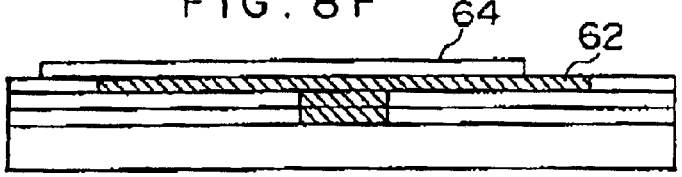

Next, as shown in FIGS. 7D and 8D, the central portion of the insulating substrate 10 is covered by a solid partitioning wall 60 in whose central portion a laterally-long groove 58 is formed. As shown in FIGS. 7E and 8E, a metal wiring pattern 62 is formed in the groove 58. In this way, the metal wiring pattern 57 and the metal wiring pattern 62 are electrically connected. Next, as shown in FIGS. 7F and 8F, the surface of the metal wiring pattern 62 is covered by a protective layer 64, in a state in which the electrode portion of the metal wiring pattern 62 is exposed.

Next, a fifth embodiment will be described.

Figure 10A:
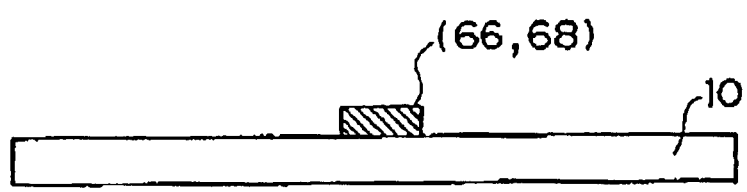
FIGS. 10A and 10B are cross-sectional views showing the manufacturing processes of the wiring pattern forming method relating to the fifth embodiment of the present invention.

In the fifth embodiment, as shown in FIGS. 8A and 10A, a wiring pattern 66 is formed by discharging and applying, from a thermal-type ink jet, droplets of a stannous chloride solution which is the core of plating, onto the surface of the insulating substrate 10 without forming a solid partitioning wall. Next, after drying and rinsing, a solution containing palladium which is a catalyst (a palladium chloride aqueous solution) is coated thereon by an ink jet head. Subsequently, when a copper plating liquid is applied, the copper ions within the solution are reduced with the palladium which is a catalyst being the core. The copper precipitates, and a metal wiring pattern 68 is formed.

Figure 9A:
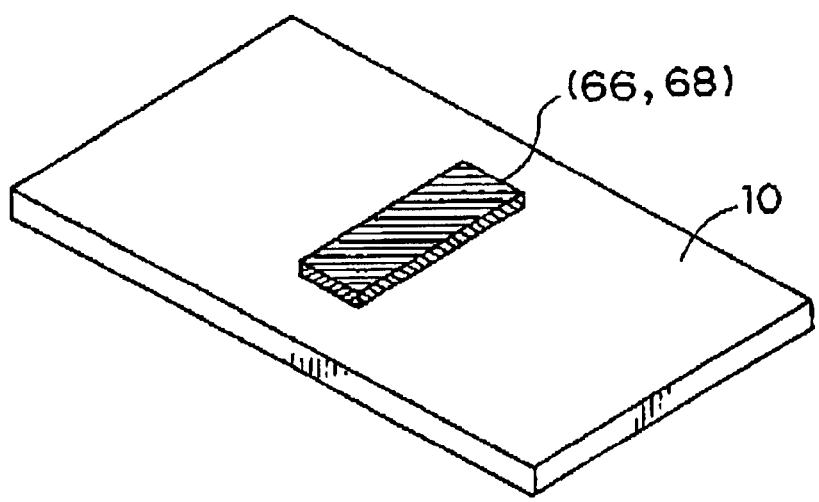
FIGS. 9A and 9B are perspective views showing manufacturing processes of a wiring pattern forming method relating to a fifth embodiment of the present invention.
Figure 9B:
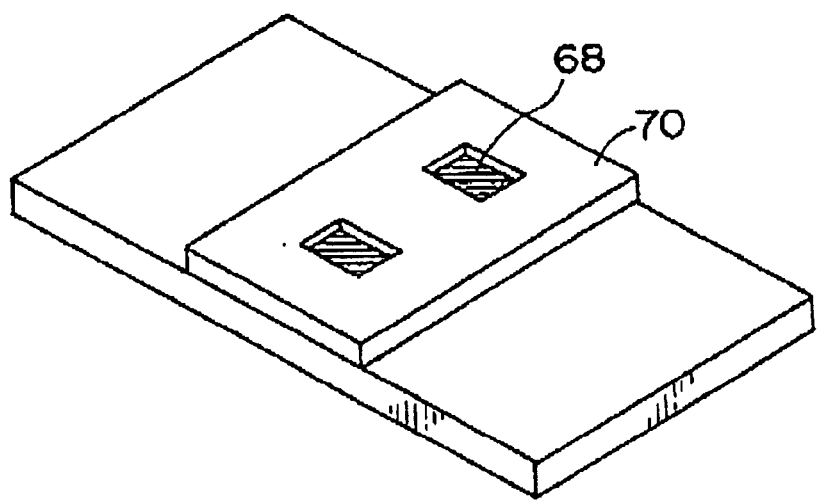
Figure 10B:
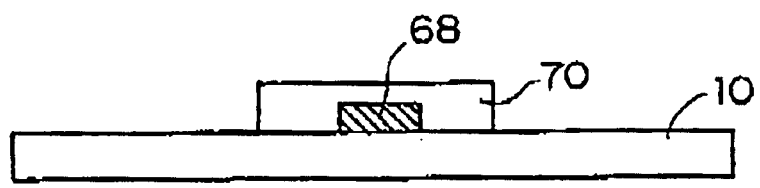

Finally, as shown in FIGS. 9B and 10B, the surface of the metal wiring pattern 68, except for the electrode portions at the both end portions, is covered by a protective film 70 of polyimide resin.

A sixth embodiment will be described next.

Figure 11A:
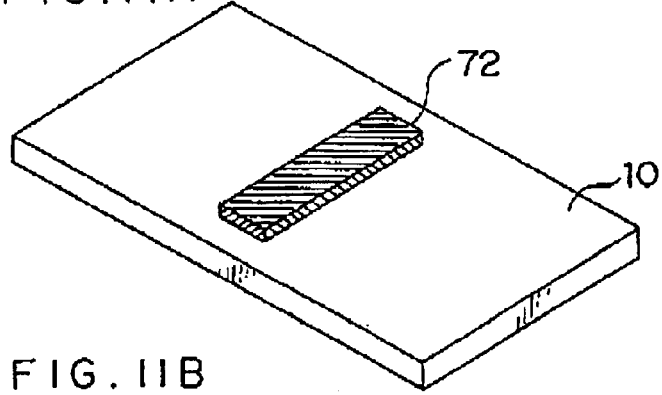
FIGS. 11A through 11D are perspective views showing manufacturing processes of a wiring pattern forming method relating to a sixth embodiment of the present invention.
Figure 11B:
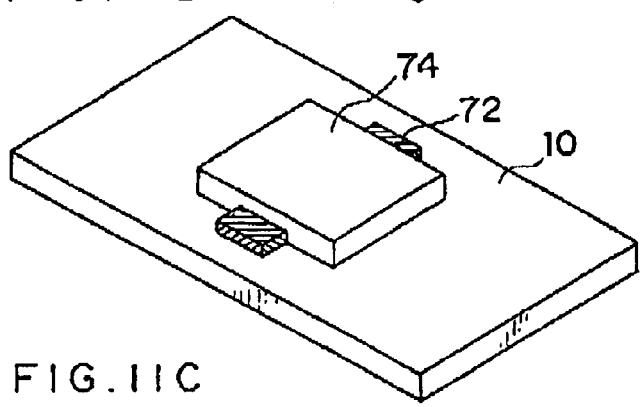
Figure 12A:
FIGS. 12A through 12D are cross-sectional views showing the manufacturing processes of the wiring pattern forming method relating to the sixth embodiment of the present invention.
Figure 12B:
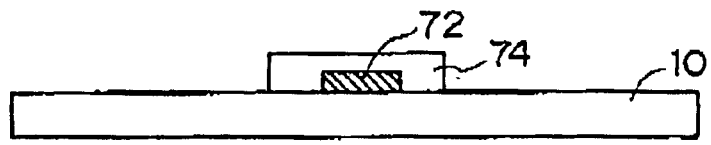

In the sixth embodiment, as shown in FIGS. 11A and 12A, a metal wiring pattern 72 is formed on the surface of the insulating substrate 10 by an ink jet method and by chemical reaction of a stannous chloride solution, a palladium chloride aqueous solution, and a copper plating liquid, without forming a solid partitioning wall. Next, as shown in FIGS. 11B and 12B, the surface of the metal wiring pattern 72 is covered by a protective layer 74 of polyimide resin, except for the electrode portions at the both end portions of the metal wiring pattern 72.

Figure 11C:
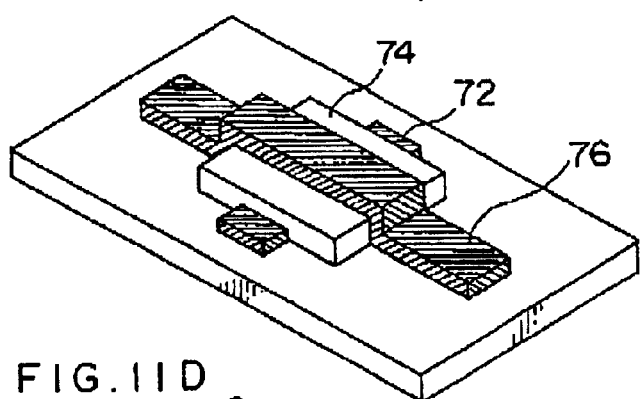
Figure 11D:
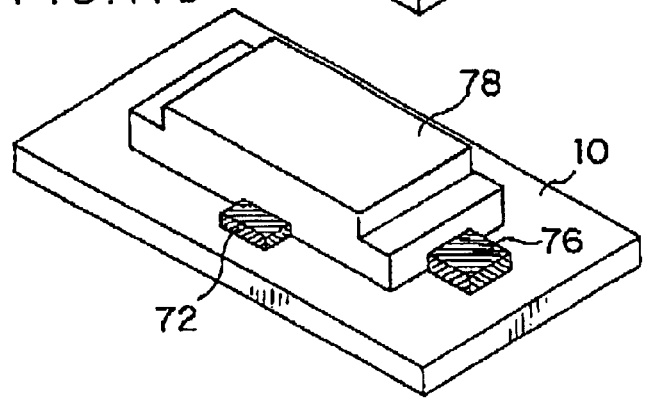
Figure 12C:
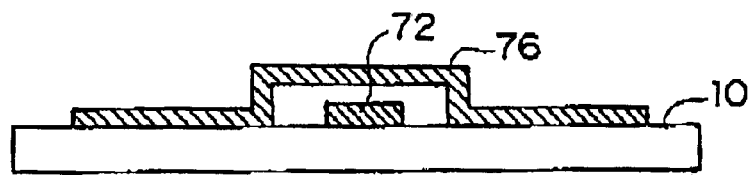
Figure 12D:
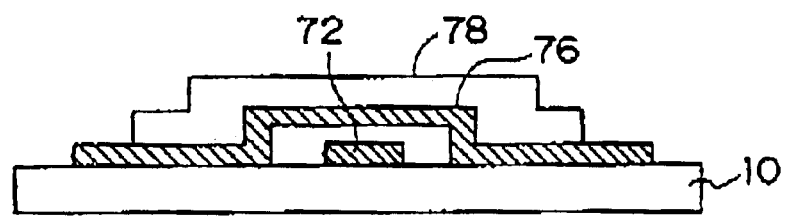

Next, as shown in FIGS. 11C and 12C, a metal wiring pattern 76 is formed so as to traverse the protective layer 74, by an ink jet method and by chemical reaction of a stannous chloride solution, a palladium chloride aqueous solution, and a copper plating liquid. Then, as shown in FIGS. 11D and 12D, the surface of the metal wiring pattern 76 is covered by a protective layer 78 of polyimide resin, except for the electrode portions at the both end portions of the metal wiring patterns 72, 76.

Next, a seventh embodiment will be described.

Figure 14A:
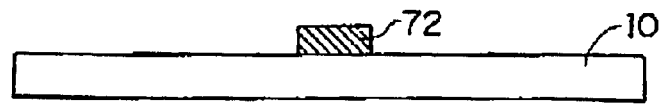
FIGS. 14A through 14E are cross-sectional views showing the manufacturing processes of the wiring pattern forming method relating to the seventh embodiment of the present invention.
Figure 14B:
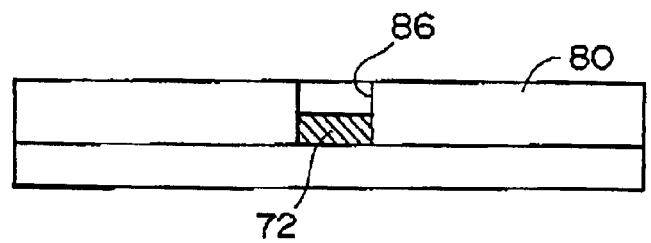

In the seventh embodiment, as shown in FIGS. 13A and 14A, the metal wiring pattern 72 is formed on the surface of the insulating substrate 10 by an ink jet method and by chemical reaction of a stannous chloride solution, a palladium chloride aqueous solution, and a copper plating liquid, without forming a solid partitioning wall. Next, as shown in FIGS. 13B and 14B, the entire surface of the insulating substrate 10 is covered by a protective layer 80 of polyimide resin, except for the electrode portion at the central portion.

Figure 14C:
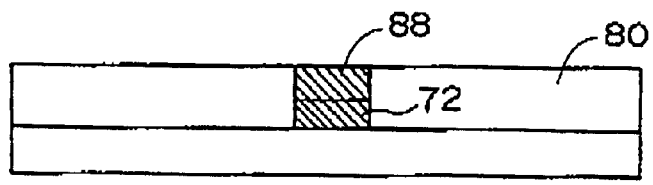
Figure 14D:
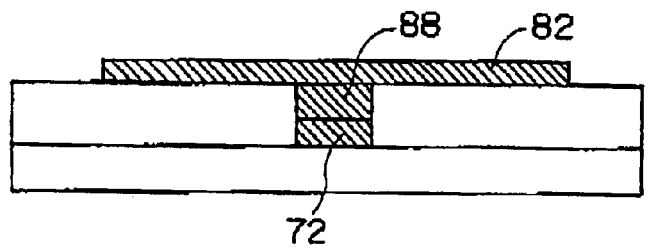
Figure 14E:
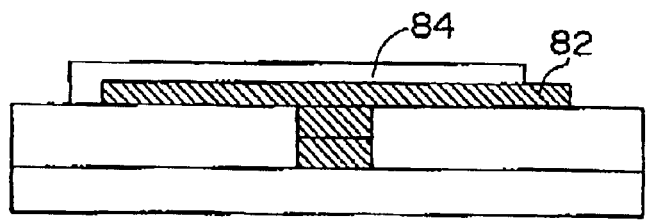

Subsequently, as shown in FIGS. 13C and 14C, a metal wiring pattern 88 is formed in a groove 86 of the protective layer 80, and is three-dimensionally connected to the electrode portion of the metal wiring pattern 72. Next, as shown in FIGS. 13D and 14D, a metal wiring pattern 82 is formed on the protective layer 80 so as to be electrically connected to the metal wiring pattern 88, by an ink jet method and by chemical reaction of a stannous chloride solution, a palladium chloride aqueous solution, and a copper plating liquid. Then, as shown in FIGS. 13E and 14E, the surface of the metal wiring pattern 82 is covered by a protective layer 84 of polyimide resin, except for the electrode portion at one end portion.

Next, an eighth embodiment will be described.

Figure 15A:
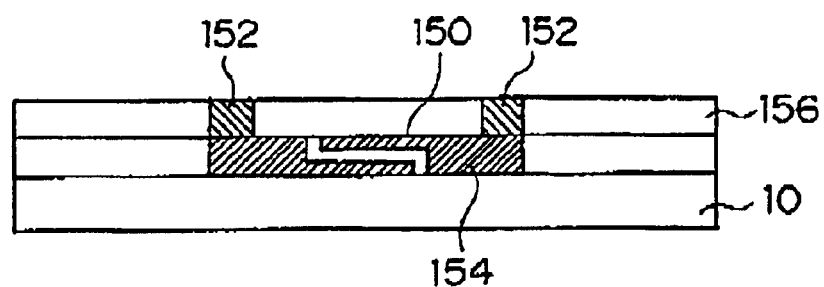
FIG. 15A is a cross-sectional view showing a capacitor formed in a planar form according to a wiring pattern forming method relating to an eighth embodiment of the present invention.
Figure 15B:
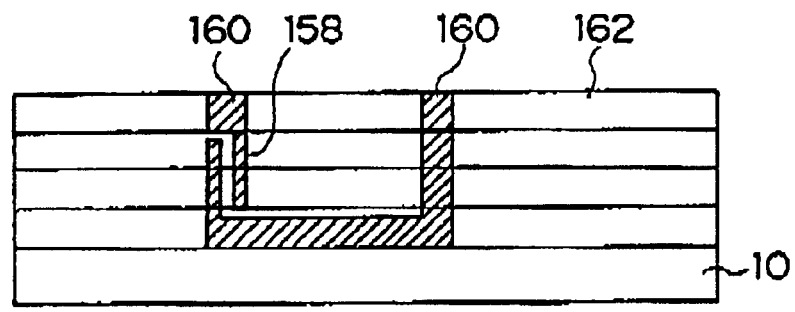
FIG. 15B is a cross-sectional view showing a capacitor formed in a layer direction according to the wiring pattern forming method relating to the eighth embodiment of the present invention.

In the eighth embodiment, as shown in FIG. 15A, a capacitor 150 is formed on the surface of the insulating substrate 10 by adjusting the thickness of a metal wiring pattern 154. At this time, except for electrode portions 152, the metal wiring pattern is covered by a protective layer 156. Moreover, as shown in FIG. 15B, a capacitor 158 can also be formed in the layer direction. At this time, the metal wiring pattern is covered by a protective layer 162, except for electrode portions 160.

A ninth embodiment will be described next.

In the ninth embodiment, as shown in FIG. 16A, a resistor 168 is formed on the surface of the insulating substrate 10 by adjusting the thickness of a metal wiring pattern 164. At this time, except for electrode portions 166, the metal wiring pattern is covered by a protective layer 170. Moreover, as shown in FIG. 16B, a resistor 172 can also be formed in the layer direction. At this time, the metal wiring pattern is covered by a protective layer 178, except for electrode portions 174.

Figure 17A:
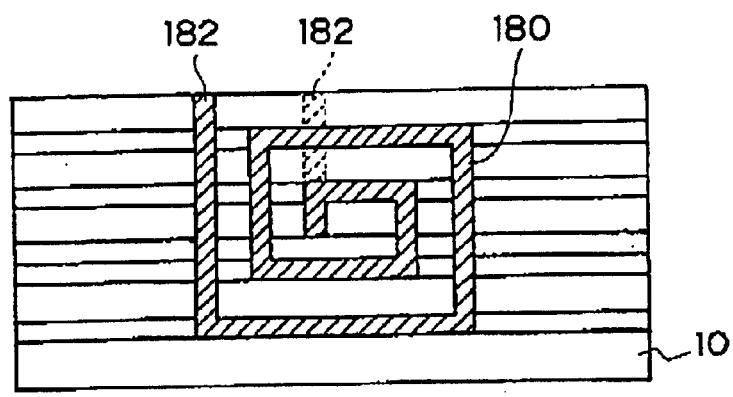
FIG. 17A is a cross-sectional view showing a coil formed in a layer direction according to a wiring pattern forming method relating to a tenth embodiment of the present invention.
Figure 17B:
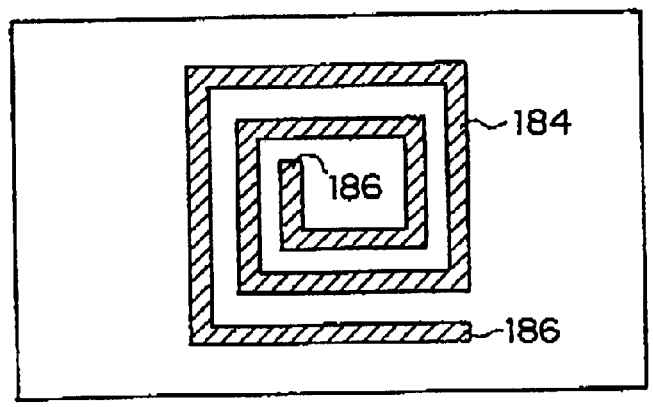
FIG. 17B is a plan view showing a coil formed in a planar form according to the wiring pattern forming method relating to the tenth embodiment of the present invention.

In a tenth embodiment, as shown in FIG. 17A, a coil is formed in the layer direction at a metal wiring pattern 180, and inductance is generated. At this time, an electrode portion 182 shown by the dashed lines is formed so as to stand up to the surface, in the layer direction, from the back in the direction perpendicular to the surface of the drawing of FIG. 17A. Further, as shown in FIG. 17B, a coil can also be formed in a planar form at a metal wiring pattern 184. At this time, the metal wiring pattern is covered by a protective layer, except at electrode portions 186.

Next, a wiring pattern forming device which forms wiring patterns will be described.

Figure 18:
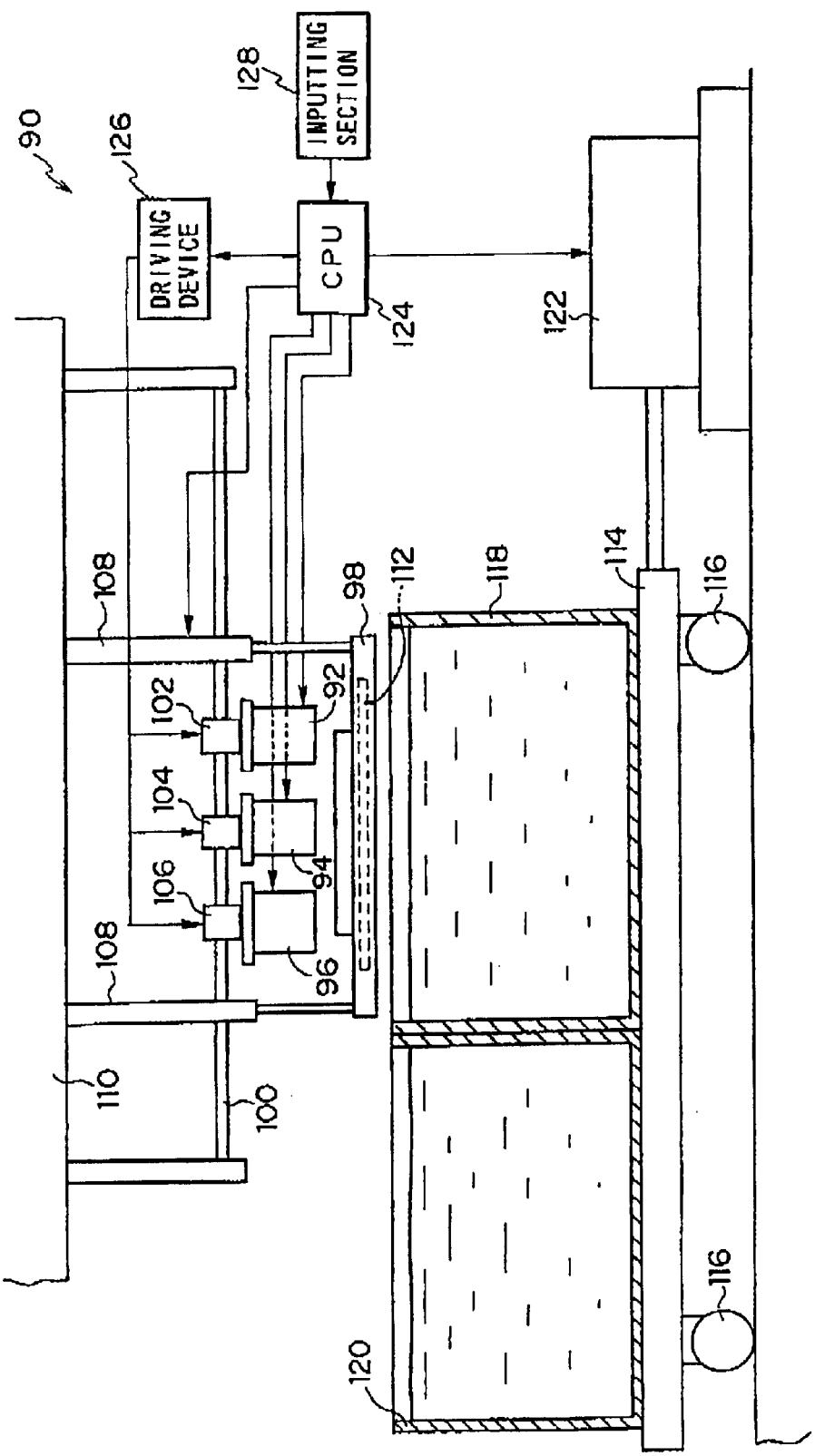
FIG. 18 is a front view showing a wiring pattern forming device relating to the present invention.

As shown in FIGS. 18 and 19, the wiring pattern forming device 90 has an insulating solution line ink jet head 92, a conductive solution line ink jet head 94, and a growth core solution line ink jet head 96, each of which, by an ink jet system, discharges droplets from nozzles M lined up in a line.

These ink jet heads are supported by guide portions 102, 104, 106 which move independently of one another. The guide portions 102, 104, 106 are guided by guide rails 100 disposed above a base 98, and move along the base 98. Timing belts 101 are connected to the guide portions 102, 104, 106. The timing belts 101 are trained around pulleys 103. Due to the pulleys 103 being rotated by a driving device 126, the insulating solution line ink jet head 92, the conductive solution line ink jet head 94, and the growth core solution line ink jet head 96 are moved along the base 98.

The base 98 is suspended from oil pressure cylinders 108 fixed to a beam 110. The base 98 is raised and lowered by the oil pressure cylinders 108 being contracted and extended. A heater 112, which has been subjected to a waterproofing treatment, is built-in in the base 98. The heater 112 heats a region which is larger than the surface area of the insulating substrate 10 set on the base 98, and uniformly heats and dries the insulating substrate 10.

A rack 114 is disposed beneath the base 98. A plating tank 118 in which copper plating liquid is stored, and a rinsing tank 120 in which rinsing water is stored, are placed on the rack 114. Further, wheels 116 are provided at the bottom surface of the rack 114. By extending and contracting (pushing-out and pulling-in) an oil pressure cylinder 122 disposed on the floor, the plating tank 118 or the rinsing tank 120 is moved to beneath the base 98.

The insulating solution line ink jet head 92, the conductive solution line ink jet head 94, the growth core solution line ink jet head 96, the oil pressure cylinders 128, 122, and the driving device 126 are driven and controlled by a CPU 124. The layout of the wiring pattern and the protective layer is inputted to the CPU 124 from an inputting section 128. On the basis of this layout information, the CPU 124 drives and controls the ink jet heads and the like.

Next, operation of the wiring pattern forming device 90 will be described by using the insulating substrate 10 shown in FIG. 1 as an example.

When the insulating substrate 10 is set on the base 98 at a predetermined position, the insulating solution line ink jet head 92 scans along the guide rails 100, and forms, on the surface of the insulating substrate 10, the solid partitioning wall 12 by discharging droplets of a resin solution, in which polyimide is diluted in an organic solvent, from discharging nozzles corresponding to the position of the solid partitioning wall 12.

In this way, by arranging the discharging nozzles in the form of a line, the resin solution can be discharged at once over the entire transverse direction of the insulating substrate, and the productivity is therefore improved. Moreover, the accuracy of the positions where the droplets land is also improved because the discharging nozzles do not scan in the transverse direction.

Next, the conductive solution line ink jet head 94, while scanning, discharges and coats droplets of a stannous chloride solution into the groove 14 of the solid partitioning wall 12. Here, the heater 112 heats the insulating substrate 10, and dries the stannous chloride solution. When the solution has dried, the oil pressure cylinders 108 are extended such that the base 98 is immersed in the rinsing tank 120 and rinsing processing is carried out.

The insulating substrate 10 which has been subjected to the rinsing processing is pulled up by the oil pressure cylinders 108 being contracted. Here, the growth core solution ink jet head 96, while scanning, discharges and coats droplets of a palladium chloride aqueous solution into the groove 14 of the solid partitioning wall 12.

Next, the oil pressure cylinder 122 is operated so as to move the plating tank 118 to beneath the base 96. Then, when the oil pressure cylinders 108 are extended such that the base 98 is immersed in the plating tank 118, the copper ions within the solution are reduced, the copper precipitates, and the metal wiring pattern 16 is formed.

In this way, by forming the plating tank and the rinsing tank to be integral with the ink jets which are used as a printing device, the space required for manufacturing the wiring substrate can be reduced.

Moreover, a solution in which a metal-containing-solution which is the core of the plating is dispersed in water, is good with respect to formation of an extremely thin film. Thus, a fine pattern can be formed. Moreover, by using polyimide resin which dries easily as the solid partitioning wall, the region of coating of the aqueous solution which contains palladium which is a low-viscosity catalyst, can be limited to a narrow region. In this way, fine wiring can be obtained by the plating.

In addition, a tall solid partitioning wall can easily be formed by utilizing high-viscosity polyimide resin. Further, because the wiring pattern is formed by an ink jet method, it is possible to easily join the wires at the obverse and reverse surfaces of the wiring substrate.

By using a thermal-type ink jet head, it is easy to fabricate discharging openings at a high density.

The present invention can be used in the formation of minute, highly-integrated wiring patterns which are needed in making electronic devices more compact and more high-performance, and is useful in shortening the lead time of the manufacturing process.

Because the present invention has the above-described structure, the present invention can flexibly handle changes in wiring patterns without requiring a mask. Moreover, the present invention is relatively strong with respect to dust and defects existing on a substrate, and there is no waste of solution during the coating processes.

What is claimed is:

1. A pattern forming device comprising:
   an insulating solution ink jet head discharging an insulating material forming solution;
   a conductive solution ink jet head discharging a conductive material forming solution;
   a growth core solution ink jet head discharging a solution which becomes a growth core;
   a heating mechanism heating an insulating substrate set on a base;
   a head scanning mechanism which causes the insulating solution ink jet head, the conductive solution ink jet head, and the growth core solution ink jet head to scan above the base;

a control mechanism which, on the basis of inputted layout information of a wiring pattern and a protective layer protecting the wiring pattern, operates the scanning mechanism and makes droplets be discharged from nozzles of the insulating solution ink jet head, the conductive solution ink jet head, and the growth core solution ink jet head;

a base raising/lowering mechanism which raises and lowers the base; and a moving mechanism at which a rinsing tank and a plating tank are disposed, and which moves one of the rinsing tank and the plating tank to beneath the base as needed.

2. The pattern forming device of claim 1, wherein the insulating solution ink jet head, the conductive solution ink jet head, and the growth core solution ink jet head are disposed in lines.

3. The pattern forming device of claim 2, wherein the insulating solution ink jet head, the conductive solution ink jet head, and the growth core solution ink jet head are movable only in a direction substantially perpendicular to a direction in which the insulating solution ink jet head, the conductive solution ink jet head, and the growth core solution ink jet head are disposed in lines.

4. The pattern forming device of claim 1, wherein the conductive solution ink jet head and the growth core solution ink jet head are thermal-type ink jet heads.

5. The pattern forming device of claim 1, wherein the insulating solution ink jet head, the conductive solution ink jet head, and the growth core solution ink jet head are each provided with a plurality of nozzles which discharge droplets.

* * * * *